(12) United States Patent
Rassel et al.

(10) Patent No.: US 7,548,387 B2
(45) Date of Patent: Jun. 16, 2009

(54) OPTICAL IMAGING DEVICE

(75) Inventors: Thorsten Rassel, Buehlerzell (DE); Erich Merz, Essingen (DE); Martin Mahlmann, Tuebingen (DE)

(73) Assignee: Carl Zeiss SMT AG, Oberkochen (DE)

( * ) Notice: Subject to any disclaimer, the term of this patent is extended or adjusted under 35 U.S.C. 154(b) by 209 days.

(21) Appl. No.: 11/278,850

(22) Filed: Apr. 6, 2006

(65) Prior Publication Data

US 2006/0230413 A1    Oct. 12, 2006

(30) Foreign Application Priority Data

Apr. 6, 2005    (DE)    ........................ 10 2005 015 627

(51) Int. Cl.
    *G02B 7/02*    (2006.01)
(52) U.S. Cl. ...................... 359/822; 359/819
(58) Field of Classification Search ................ 359/811, 359/812, 813, 816, 819, 822, 823–840
See application file for complete search history.

(56) References Cited

U.S. PATENT DOCUMENTS

| | | | | |
|---|---|---|---|---|
| 4,289,403 | A * | 9/1981 | Allington | 356/491 |
| 4,638,471 | A | 1/1987 | van Rosmalen | |
| 5,177,640 | A | 1/1993 | Grassens | |
| 6,031,812 | A | 2/2000 | Liou | |
| 6,552,774 | B2 * | 4/2003 | Hase et al. | 355/53 |
| 6,580,570 | B2 | 6/2003 | Becker et al. | |
| 6,825,932 | B2 * | 11/2004 | Suzuki et al. | 356/401 |
| 7,172,918 | B2 * | 2/2007 | Arno | 438/50 |
| 7,259,836 | B2 * | 8/2007 | Ohishi | 355/75 |
| 2005/0002008 | A1 | 1/2005 | De Weerdt et al. | |
| 2005/0008269 | A1 | 1/2005 | Akutsu et al. | |
| 2006/0209278 | A1 | 9/2006 | Kiuchi et al. | |

FOREIGN PATENT DOCUMENTS

| | | |
|---|---|---|
| DE | 199 01 295 A1 | 7/2000 |
| DE | 100 51 706 A1 | 5/2002 |
| DE | 102 18 989 A1 | 11/2003 |
| FR | 2 713 292 A1 | 6/1995 |
| JP | 1-84636 * | 7/1989 |
| JP | 20000339715 A | 12/2000 |
| JP | 2001134967 A | 5/2001 |
| JP | 2001160224 A | 6/2001 |
| JP | 2001184684 A | 7/2001 |
| JP | 2002250341 A | 9/2002 |
| JP | 2003272614 A1 | 7/2003 |
| JP | 2003-272614 | 9/2003 |

(Continued)

*Primary Examiner*—Timothy J Thompson
(74) *Attorney, Agent, or Firm*—Fish & Richardson P.C.

(57) ABSTRACT

An optical imaging device (1a) has at least one optical element (2) which is provided with an outer frame (1), an inner ring (4) in which the optical element (2) is mounted, and a manipulator instrument having at least one actuator. Contactless linkage of the inner ring (4) to the outer frame (1) is provided in at least one degree of freedom by means of a support (5) arranged between the inner ring (4) and the outer frame (1). The manipulator instrument has at least one actuator (8), the setting forces and/or bearing forces of which act contactlessly on the inner ring (4), for mounting and/or positioning and/or manipulating the inner ring (4) relative to the outer frame (1).

20 Claims, 1 Drawing Sheet

FOREIGN PATENT DOCUMENTS

| | | |
|---|---|---|
| JP | 2004-044801 | 2/2004 |
| JP | 2004044801 | 2/2004 |
| JP | 2004080877 A | 3/2004 |
| JP | 2004177885 A | 6/2004 |
| WO | 03/092256 A2 | 11/2003 |
| WO | 2005/006417 A1 | 1/2005 |

\* cited by examiner

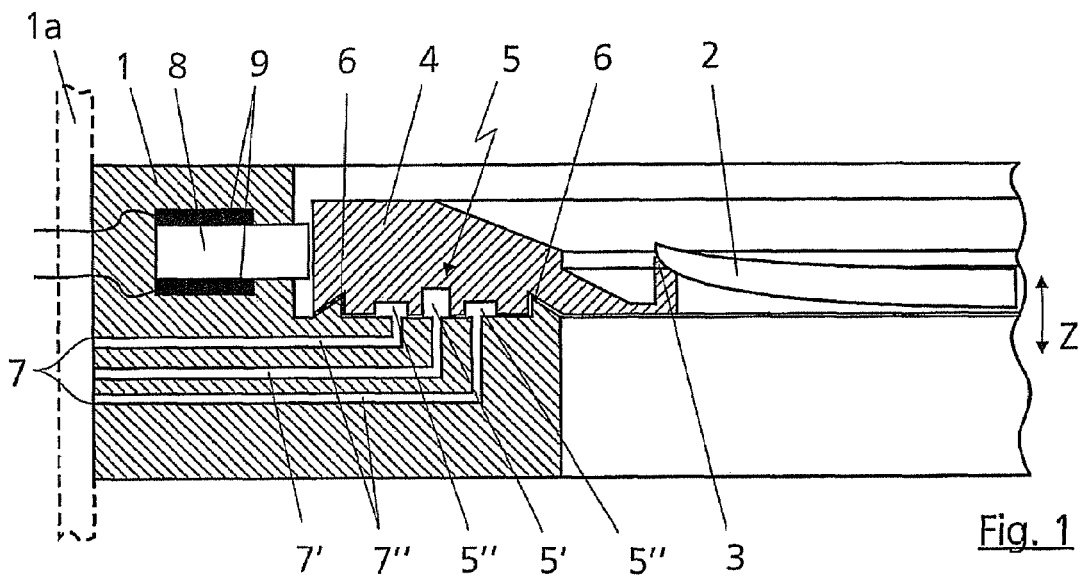
Fig. 1
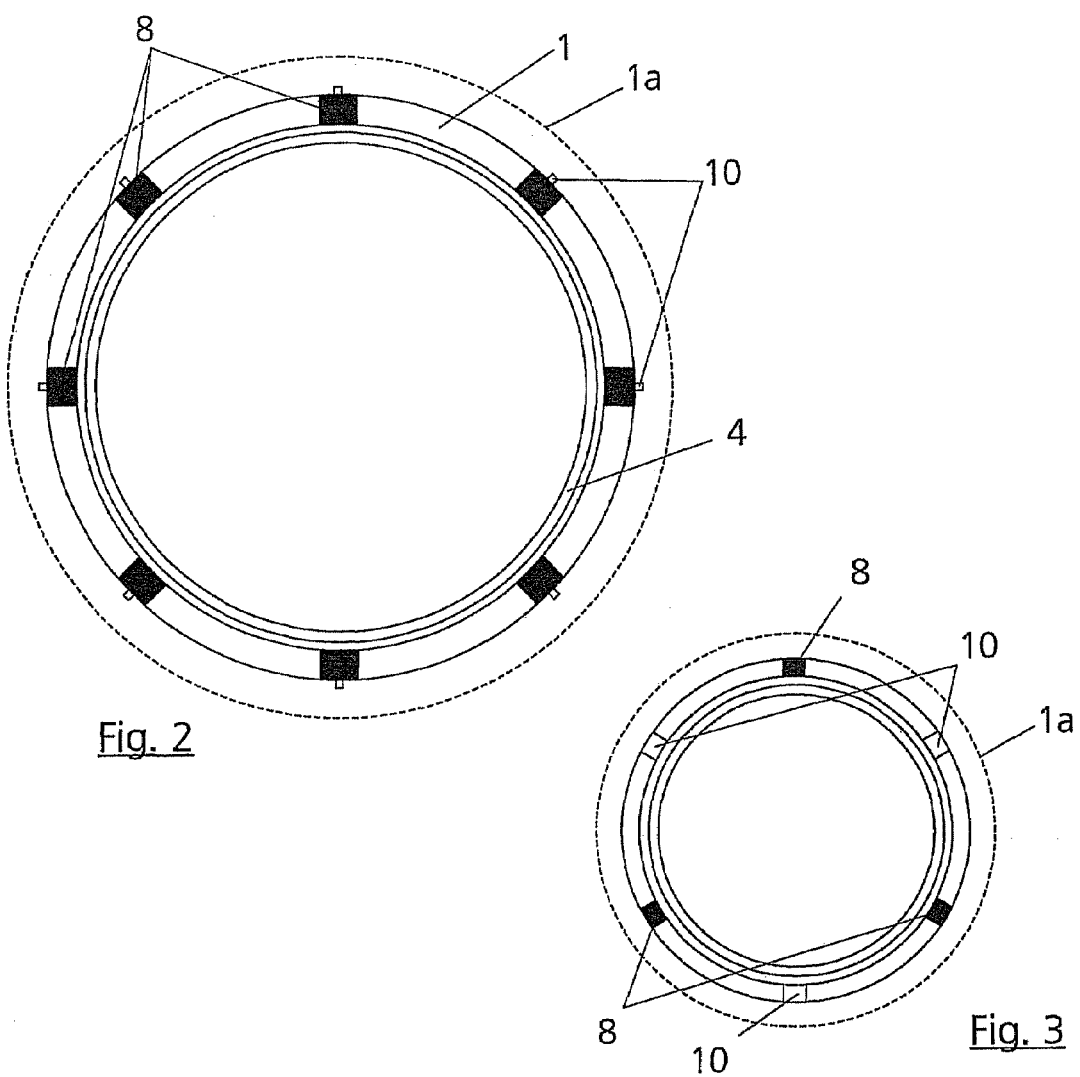
Fig. 2
Fig. 3

OPTICAL IMAGING DEVICE

BACKGROUND OF THE INVENTION

1. Field of the Invention

The invention relates to an optical imaging device having at least one optical element which is provided with an outer frame, an inner ring in which the optical element is mounted, and a manipulator instrument having at least one actuator. The invention furthermore relates to a projection objective for microlithography.

2. Description of the Related Art

DE 199 01 295 A1 discloses an optical imaging device having an optical element, the optical element, e.g. a lens, being mounted in an inner ring which is connected to an outer frame by leaf springs and setting levers. A manipulator instrument for displacing the optical element is designed so that the articulations employed serve as a manipulator instrument with adjusting components between the inner ring and the outer frame. Adjusting screws engage on the adjusting components as actuators for displacing the optical element. Adjustment of the adjusting screws leads to a displacement of the inner ring relative to the outer frame.

DE 100 51 706 A1 furthermore discloses a device for mounting an optical element, the device being provided with an inner frame and an outer frame. The inner frame is connected to the outer frame by three solid-state articulations arranged distributed over the circumference, with actuators which can displace the inner frame engaging on the solid-state articulations.

These documents disclose that it is possible to induce forces and moments in the inner ring by direct linkage of the outer frame to the inner ring, although these can cause a deformation of the inner ring and therefore a deformation of the lens. Parasitic effects can therefore act on the lens, such as tilting, astigmatism and other higher-order deformations.

SUMMARY OF THE INVENTION

It is therefore an object of the present invention to improve an optical imaging device of the type mentioned in the introduction, so as to minimize deformations and parasitic effects such as tilting movements on an optical element to be manipulated.

The object is achieved according to the invention in that contactless linkage of the inner ring to the outer frame is provided in at least one degree of freedom by means of a support arranged between the inner ring and the outer frame, the manipulator instrument having at least one actuator, the setting forces and/or bearing forces of which act contactlessly on the inner ring, for mounting and/or positioning and/or manipulating the inner ring relative to the outer frame.

According to the invention there is no solid linkage of the inner ring to the outer frame in the at least one degree of freedom, but instead the inner ring is connected to the outer frame by "contactless" bearing. In the case of contactless linkage in six degrees of freedom, this achieves total decoupling of parasitic effects, for example tilting movements, with respect to deformations of the inner ring and tensions in the linkages. The inner ring is positioned contactlessly by at least one, and preferably two actuators. In this way, the movement of the inner ring can take place linearly in the intended direction without link mechanisms and without support.

In general, the aforementioned decoupling takes place along that degree of freedom or those degrees of freedom along which there is no solid linkage. The remaining degrees of freedom may be implemented by means of mechanical bearing devices, for example connecting the inner ring and the outer frame.

In a preferred refinement, the outer frame may be provided with mechanical end stops, so that the path of the inner ring can be limited.

Such an optical imaging device according to the invention may preferably be employed in the field of microlithography, in which case can optical imaging device according to the invention may be used for optical elements, for example lenses or mirrors, in projection exposure apparatus.

Further refinements of the invention are specified in the dependent claims.

Exemplary embodiments of the invention will be explained in principle below in more detail with the aid of drawings.

BRIEF DESCRIPTION OF THE DRAWINGS

FIG. 1 shows a representation of an optical imaging device having an optical element and a bearing in section;

FIG. 2 shows a representation of the imaging device represented in FIG. 1 in a plan view; and FIG. 3 shows a representation of the imaging device shown in FIG. 2 with a 120° arrangement of actuators.

DETAILED DESCRIPTION

FIG. 1 shows a partial section of an outer frame 1 of an optical imaging device, overall indicated only partially and schematically in dashes, in the form of an objective housing part 1a. The optical imaging device 1a may be intended as the projection objective for a projection exposure apparatus in microlithography. A projection exposure apparatus having a projection objective is described for example in DE 102 18 989 A1, for which reason further details will not be given here. DE 102 18 989 A1 nevertheless represents a part of the disclosure. A lens, as an example of an optical element 2, is connected via a support device 3 to an inner ring 4. An indirect or contactless linkage of the inner ring 4 to the outer frame 1 is provided by means of a bearing 5, arranged between the inner ring 4 and the outer frame 1, which preferably comprises a gas bearing and/or generally a fluid bearing, a magnetic, electromagnetic and/or electrostatic bearing. FIG. 1 represents a gas bearing by way of example. This means that the outer frame 1 and the inner ring 4 are respectively separate components, which are not connected directly to each other by the bearing 5. Air is preferably used for the gas bearing 5, primarily since it is substantially more cost-effective compared with other gases. The choice of the gas nevertheless depends on where the objective is used. If the entire objective is flushed with nitrogen or helium, as is the case for example with projection objectives in semiconductor lithography for operation with wavelengths of an exposure beam at 193 nm or less, care should be taken that the gas used for the gas bearing is the same medium as that already contained in the objective, since a minimal gas stream will emerge laterally in the direction of the optical element 2 when using a gas bearing for mounting the inner ring 4 on the outer frame 1. Instead of the gas bearing 5, the inner ring 4 could also be mounted via a liquid bearing, in which case corresponding design modifications of the overall structure of the optical imaging device 1a would need to be provided. For example, it is then necessary to ensure that the liquid does not enter the space of the lens 2, since it could cause chemical reactions there. Preferably, but not necessarily, the contactless mounting or linkage of the inner ring 4 on the outer frame 1 is carried out in all six degrees of freedom of the inner ring 4.

Two mechanical end stops 6, which delimit the possible displacement path of the inner ring 4, are fitted on the outer frame 1.

For contactless mounting of the inner ring 4 in the exemplary embodiment according to FIG. 1, it is provided with three annular recesses 5 distributed over the circumference, which are fitted on a side of the inner ring 4 next to the outer frame 1. Lines 7, which transport the respective gas into a recess 5' or discharge the gas from recesses 5", are in this case used for the gas feed and gas discharge. In the exemplary embodiment represented, a gas feed line 7' is represented which is arranged between two gas discharge lines 7". This arrangement is advantageous because there is centrally a gas feed which is respectively provided on each side with a gas discharge, so that an air cushion is created between the inner ring 4 and the outer frame 1. When a slight positive pressure prevails in the gas feed line 7' of the gas bearing 5 and a slight negative pressure prevails in the two gas discharge lines 7", then it is possible for there to be only a very minimal loss of the gas flowing away or emerging laterally. It is also possible to provide only one gas discharge line 7" besides the gas feed line 7', and therefore to produce a gas bearing 5 between the inner ring 4 and the outer frame 1 by different gas pressures between the gas feed line 7' and the gas discharge line 7". Only two annular recesses 5 in the inner ring 4 are necessary in this case.

The inner ring 4 is positioned contactlessly by actuators 8 applied radially on the outer frame 1, or by at least one actuator. The actuators or setting elements 8 may comprise magnets and/or electromagnets and/or air nozzles or be embodied as such. They are embodied as electromagnets according to the exemplary embodiment in FIG. 1, with solenoids 9 respectively being used to activate the electromagnets. By different powering of the electromagnets, the movement of the inner ring 4 can take place linearly in the required direction without link mechanisms and without support, so that the inner ring 4 with the optical element 2 can be positioned with a high accuracy without parasitic effects, for example tilting movements, being transmitted onto the optical element 2 to be manipulated. For contactless manipulation of the inner ring 4 by the electromagnets or at least one electromagnet, it must therefore comprise a magnetic or magnetizable material, in which case the inner ring 4 may also comprise permanent magnets in order to permit manipulation by at least one electromagnet, for example. As an alternative or in addition to the electromagnets, which are also referred to as Maxwell actuators, it is also possible to use force-controlled actuators, for example Lorentz actuators.

When air nozzles are used as actuators 8, air exit openings of the air nozzles being directed toward the inner ring 4, the inner ring 4 can be moved and positioned by setting up different gas or air pressures at the air exit openings.

Actuators which are based on the principle of electrostatics may furthermore be used.

FIG. 2 shows the optical imaging device 1a with the bearing of FIG. 1 in a plan view. In the exemplary embodiment represented, eight actuators 8 arranged at a mutual spacing are provided in the outer frame 1. It is therefore possible to ensure total decoupling of parasitic effects with respect to deformations of the inner ring and tensions in the linkages, as in conventional manipulators.

The mounting by the bearing 5, preferably a gas bearing and/or magnetic bearing, may nevertheless be intended to introduce deformations into the optical element 2, in which case a corresponding deformation can be induced depending on the number of actuators 8. By anti-phase driving of respectively opposite actuators 8, for example, it is possible to introduce an intended astigmatism or even higher-order deformation into the optical element 2. A third-order deformation can be produced by using at least three actuators 8, for example, and an astigmatism can be produced by using at least four actuators 8.

Induction of a tilt of the optical element 2 may also be provided by such mounting, in which case the bearing 5 should be divided into two or more bearing segments arranged at the circumferential region between the inner ring 4 and the outer frame 1, which likewise should also have gas feed and gas discharge lines in the case of a gas bearing. By providing different pressures in the gas feed and gas discharge lines, and depending on the number of bearing segments, it is then possible to tilt the optical element 2 about one or more axes. Corresponding embodiments are possible by means of electromagnetic bearings, which will then be driven differently in order to tilt the optical element 2. The same applies to the other mounting options mentioned.

There are furthermore at least two sensors 10 on the manipulation instrument, which are fitted to the actuators 8 and measure the movement of the actuators 8 when positioning the inner ring 4 in the setting direction. The sensors 10 are designed as optical path length measurement systems. In FIG. 2, a sensor 10 is assigned to each actuator 8. As shown in FIG. 3, when only three actuators 8 are arranged at a spacing of 120°, it is nevertheless also possible to arrange the sensors 10 respectively opposite the actuators 8, i.e. likewise at a 120° spacing, in order to measure the movement of the actuators 8 and therefore the displacement of the inner ring 4. Other arrangements of the sensors 10 in order to record the position of the inner ring 4 relative to the outer frame 1 are of course also possible. Using the sensors 10, it is possible to exactly determine the distance traveled by the actuators 8 for the inner ring 4, and therefore finally for the entire optical element 2. Exact control of the movement of the optical element 2 can therefore be achieved by means of the bearing.

If so desired, the z position (optical axis) of the optical element 2 or the inner ring 4, represented by the arrow in FIG. 1, may additionally be influenced by gas pressure control in the gas feed and gas discharge lines 7' and 7", z representing the direction of the optical axis of the optical element 2. For example, the pressure in the gas feed line 7' may be increased so as to allow upward displacement of the inner ring 4 with the optical element 2 in the z direction. A gas reduction in the feed line 7' correspondingly allows downward displacement of the inner ring 4 with the optical element 2 in the z direction. At least one sensor 10 may likewise be used for more accurate control of the positioning in the z direction or in the axial direction, which should be arranged in the vicinity of the gas bearing 5 in order to make it possible to determine the exact position of the inner ring 4 relative to the outer frame 1. The at least one sensor 10 is not represented in FIGS. 1, 2 and 3.

A particular advantage of mounting the inner ring 4 via a bearing 5 corresponding to the present invention, for example a gas bearing relative to the outer frame 1, is that all the components can be integrated into the manipulator instrument and it is therefore possible to achieve exact control of the movement of the optical element 2. With this optical imaging device 1a, it is furthermore possible to control the position of the inner ring 4 actively, which substantially increases the quality of the optical imaging device 1a.

The manipulator instrument for the optical element 2 makes it possible to obtain a very high-performance system and therefore extremely accurate positioning of the optical element 2. A preferred field of use of such an instrument relates to the manipulation of optical elements, such as lenses or mirrors, in microlithography.

Further embodiments of the invention can also be obtained by interchanging and/or combining features of individual embodiments, as described above or as found in the dependent claims.

What is claimed is:

1. A projection objective for microlithography, having at least one optical element which is provided with an outer frame, an inner ring in which the optical element is mounted, and a manipulator instrument having at least one actuator, wherein contactless linkage of the inner ring to the outer frame is provided in at least one degree of freedom by means of a support arranged between the inner ring and the outer frame, the manipulator instrument having at least one actuator, the setting forces and/or bearing forces of which act contactlessly on the inner ring, for mounting and/or positioning and/or manipulating the inner ring relative to the outer frame to reduce parasitic effects, said at least one degree of freedom including at least one degree of freedom other than rotation about an optical axis of the projection objective, the support comprising a fluid bearing, the fluid bearing comprising a gas bearing, the gas bearing having at least one gas feed line and at least one gas discharge line.

2. The projection objective as claimed in claim 1, wherein air is provided as the gas for the gas bearing.

3. The projection objective as claimed in claim 1, wherein the at least one actuator comprises an electromagnet and/or a permanent magnet and/or a force-controlled actuator, for example a Lorentz actuator, which is mounted in the outer frame and/or in the inner ring.

4. The projection objective as claimed in claim 1, wherein at least two actuators are designed as air nozzles, the air exit openings of which are directed toward the inner ring.

5. A projection objective for microlithography, comprising:
    (a) at least one optical element which is provided with an outer frame;
    (b) an inner ring in which the optical element is mounted;
    (c) a manipulator instrument having at least one actuator, setting forces and/or bearing forces of the actuator acting contactlessly on the inner ring for mounting and/or positioning and/or manipulating the inner ring relative to the outer frame, and
    (d) a support arranged between the inner ring and the outer frame, a contactless linkage of the inner ring to the outer frame being provided, in at least one degree of freedom, by means of the support, said support comprising a fluid bearing, said fluid bearing comprising a gas bearing having at least one gas feed line and at least one gas discharge line,
    the inner ring being provided with at least two annular recesses, which are fitted on a side of the inner ring next to the outer frame and which are connected to the at least one gas feed line and the at least one gas discharge line arranged in the outer frame.

6. The projection objective as claimed in claim 5, wherein an annular recess, which is connected to the at least one gas feed line, is surrounded by two recesses arranged at a distance from it, which lie radially inward and radially outward from the annular recess and which are respectively connected to a gas discharge line.

7. A projection objective for microlithography, comprising:
    (a) at least one optical element which is provided with an outer frame;
    (b) an inner ring in which the optical element is mounted;
    (c) a manipulator instrument having at least one actuator, setting forces and/or bearing forces of the actuator acting contactlessly on the inner ring for mounting and/or positioning and/or manipulating the inner ring relative to the outer frame, and
    (d) a support arranged between the inner ring and the outer frame, a contactless linkage of the inner ring to the outer frame being provided, in at least one degree of freedom, by means of the support, and
    at least two sensors for determining the position of the inner ring in the radial direction relative to the outer frame.

8. The projection objective as claimed in claim 1, wherein at least one sensor is provided for determining the position of the inner ring in the axial direction (z position) relative to the outer frame.

9. A projection objective for microlithography, comprising:
    (a) at least one optical element which is provided with an outer frame;
    (b) an inner ring in which the optical element is mounted;
    (c) a manipulator instrument having at least one actuator, setting forces and/or bearing forces of the actuator acting contactlessly on the inner ring for mounting and/or positioning and/or manipulating the inner ring relative to the outer frame, and
    (d) a support arranged between the inner ring and the outer frame, a contactless linkage of the inner ring to the outer frame being provided, in at least one degree of freedom, by means of the support, the outer frame being provided with mechanical end stops for limiting the path of the inner ring.

10. A projection objective for microlithography, comprising:
    (a) at least one optical element which is provided with an outer frame;
    (b) an inner ring in which the optical element is mounted;
    (c) a manipulator instrument having at least one actuator, setting forces and/or bearing forces of the actuator acting contactlessly on the inner ring for mounting and/or positioning and/or manipulating the inner ring relative to the outer frame, and
    (d) a support arranged between the inner ring and the outer frame, a contactless linkage of the inner ring to the outer frame being provided, in at least one degree of freedom, by means of the support, the support comprising at least two support segments arranged on a circumferential region between the inner ring and the outer frame.

11. A projection objective for microlithography, comprising:
    (a) at least one optical element which is provided with an outer frame;
    (b) an inner ring in which the optical element is mounted;
    (c) a manipulator instrument having at least one actuator, setting forces and/or bearing forces of the actuator acting contactlessly on the inner ring for mounting and/or positioning and/or manipulating the inner ring relative to the outer frame, and
    (d) a support arranged between the inner ring and the outer frame, a contactless linkage of the inner ring to the outer frame being provided, in at least one degree of freedom, by means of the support, wherein the at least one actuator comprises three actuators which are mounted at a spacing of respectively 120° in the outer frame.

12. The projection objective as claimed in claim 11, wherein three sensors are provided for determining the position of the inner ring relative to the outer frame, which are respectively arranged at a spacing of respectively 120° opposite the actuators.

13. The projection objective as claimed in claim 7, wherein the sensors are designed as optical path length measurement systems.

14. The projection objective as claimed in claim 8, wherein the sensors are designed as optical path length measurement systems.

15. The projection objective as claimed in claim 12, wherein the sensors are designed as optical path length measurement systems.

16. A projection objective for microlithography, having at least one optical element which is provided with an outer frame, an inner ring in which the optical element is mounted, and a manipulator instrument having at least one actuator, wherein contactless linkage of the inner ring to the outer frame is provided in at least one degree of freedom by means of a support arranged between the inner ring and the outer frame, the manipulator instrument having at least one actuator, the setting forces and/or bearing forces of which act contactlessly on the inner ring, for mounting and/or positioning and/or manipulating the inner ring relative to the outer frame to reduce parasitic effects, said at least one degree of freedom including at least one degree of freedom other than rotation about an optical axis of the projection objective, wherein a least two actuators are designed as air nozzles, the air exit openings of which are directed toward the inner ring.

17. The projection objective as claimed in claim 16, wherein the support comprises a magnetic and/or electromagnetic bearing.

18. The projection objective as claimed in claim 16, wherein the support comprises a fluid bearing.

19. The projection objective as claimed in claim 18, wherein the fluid bearing comprises a gas bearing.

20. The projection objective as claimed in claim 19, wherein air is provided as the gas for the gas bearing.

* * * * *

UNITED STATES PATENT AND TRADEMARK OFFICE
CERTIFICATE OF CORRECTION

| | | |
|---|---|---|
| PATENT NO. | : 7,548,387 B2 | Page 1 of 1 |
| APPLICATION NO. | : 11/278850 | |
| DATED | : June 16, 2009 | |
| INVENTOR(S) | : Thorsten Rassel, Erich Merz and Martin Mahlmann | |

It is certified that error appears in the above-identified patent and that said Letters Patent is hereby corrected as shown below:

Column 7, line 18, Claim 16, delete "seffing" insert --setting--.

Column 8, line 6, Claim 16, delete "a" insert --at--.

Signed and Sealed this

Twenty-eighth Day of July, 2009

JOHN DOLL
*Acting Director of the United States Patent and Trademark Office*